(12) United States Patent
Lin et al.

(10) Patent No.: US 7,666,002 B2
(45) Date of Patent: Feb. 23, 2010

(54) ELECTRICAL CONNECTOR ASSEMBLY WITH FASTENING DEVICE

(75) Inventors: Nan-Hung Lin, Tu-cheng (TW); Fang-Chu Liao, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/228,980

(22) Filed: Aug. 18, 2008

(65) Prior Publication Data
US 2009/0047823 A1 Feb. 19, 2009

(30) Foreign Application Priority Data
Aug. 17, 2007 (CN) .................... 2007 2 0042936 U

(51) Int. Cl.
*H01R 12/00* (2006.01)
(52) U.S. Cl. ....................................... 439/73
(58) Field of Classification Search .................. 439/71, 439/73, 331, 487
See application file for complete search history.

(56) References Cited

U.S. PATENT DOCUMENTS

| | | | | |
|---|---|---|---|---|
| 5,221,209 A | * | 6/1993 | D'Amico ..................... | 439/71 |
| 5,302,853 A | * | 4/1994 | Volz et al. .................... | 257/707 |
| 5,588,847 A | * | 12/1996 | Tate ............................. | 439/71 |
| 6,168,451 B1 | * | 1/2001 | Lin et al. ..................... | 439/331 |
| 6,758,691 B1 | * | 7/2004 | McHugh et al. ............. | 439/331 |
| 6,991,474 B1 | * | 1/2006 | Ju ................................ | 439/73 |
| 7,008,239 B1 | * | 3/2006 | Ju ................................ | 439/71 |
| 7,077,680 B1 | * | 7/2006 | Wang et al. .................. | 439/331 |
| 2005/0048829 A1 | * | 3/2005 | Nishio et al. ................ | 439/331 |

* cited by examiner

*Primary Examiner*—Tho D Ta
(74) *Attorney, Agent, or Firm*—Andrew C. Cheng; Wei Te Chung; Ming Chieh Chang

(57) ABSTRACT

An electrical connector comprises an insulative housing (1) comprising a bottom wall (11) and a locking member (131) extending downwardly from the bottom wall (11), a plurality of contacts (4) received in the insulative housing (1) and a fastening device (3) locked with the insulative housing (1) for fastening the electronic package (2) on the insulative housing (1). Thus even if exert an upwardly force on the electronic package (2), the electronic package (2) can also securely located on the insulative housing (1).

9 Claims, 4 Drawing Sheets

ELECTRICAL CONNECTOR ASSEMBLY WITH FASTENING DEVICE

BACKGROUND OF THE INVENTION

1. Field of the Invention

The present invention relates to an electrical connector, and particularly to an electrical connector having a fastening device for fastening the electronic package on the insulative.

2. Description of the Prior Art

Electrical connectors are widely used in electrically connecting electronic packages, such as Land Grid Array (LGA) Central Processing Units (CPU), with circuit substrate, such as printed circuit boards (PCB).

Referring to FIG. 4, a conventional LGA type electrical connector (not labeled) is used for electrically connecting a CPU 20 with a PCB 40. The electrical connector comprises an insulative housing 10 with a plurality of contacts (not shown). The insulative housing 10 defines a receiving space (not shown) for receiving the CPU 20. When the CPU 20 is in the work station, it will produce quality of heat. So we usually assemble a radiator 30 on the CPU 20 to emit the heat generated by the CPU 20.

The CPU 20 located on the insulative housing 10 only depend by the force exerted by the insulative housing 10. So, when disassembled the radiator 30, the CPU 20 always be taken out by the radiator 30, thus always destroyed the CPU 20.

In view of the above, a new electrical connector that overcomes the above-mentioned disadvantages is desired.

SUMMARY OF THE INVENTION

Accordingly, an object of the present invention is to provide an electrical connector that can securely fastening the CPU on the insulative housing by a fastening device.

To fulfill the above-mentioned object, an electrical connector in accordance with a preferred embodiment of the present invention, comprises an insulative housing comprising a bottom wall and a locking member extending downwardly from the bottom wall, a plurality of contacts received in the insulative housing and a fastening device locked with the insulative housing for fastening the electronic package on the insulative housing.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
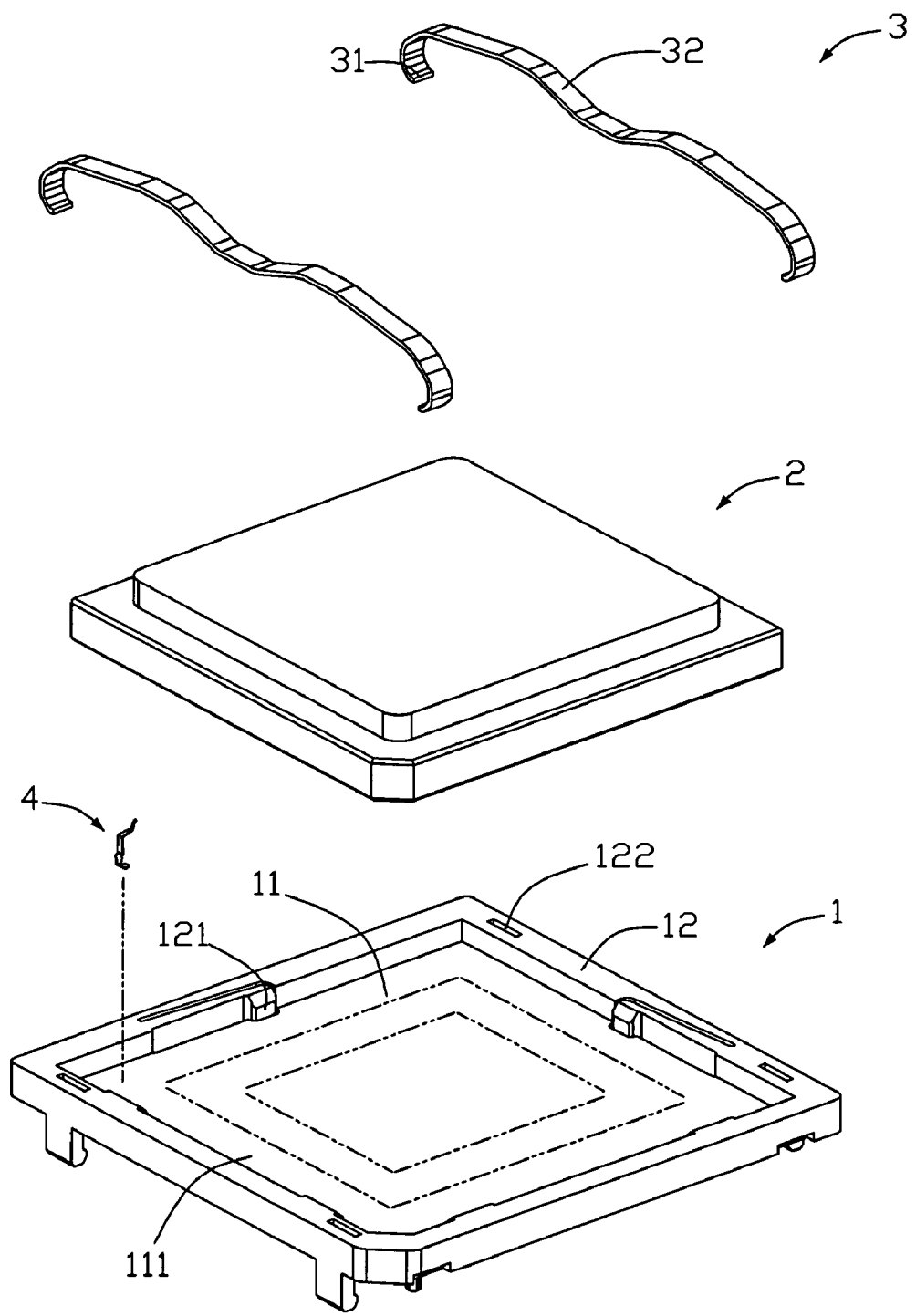
FIG. 1 is an exploded view of an electrical connector of the present invention, showing a CPU not assembled on the insulative housing.
Figure 2:
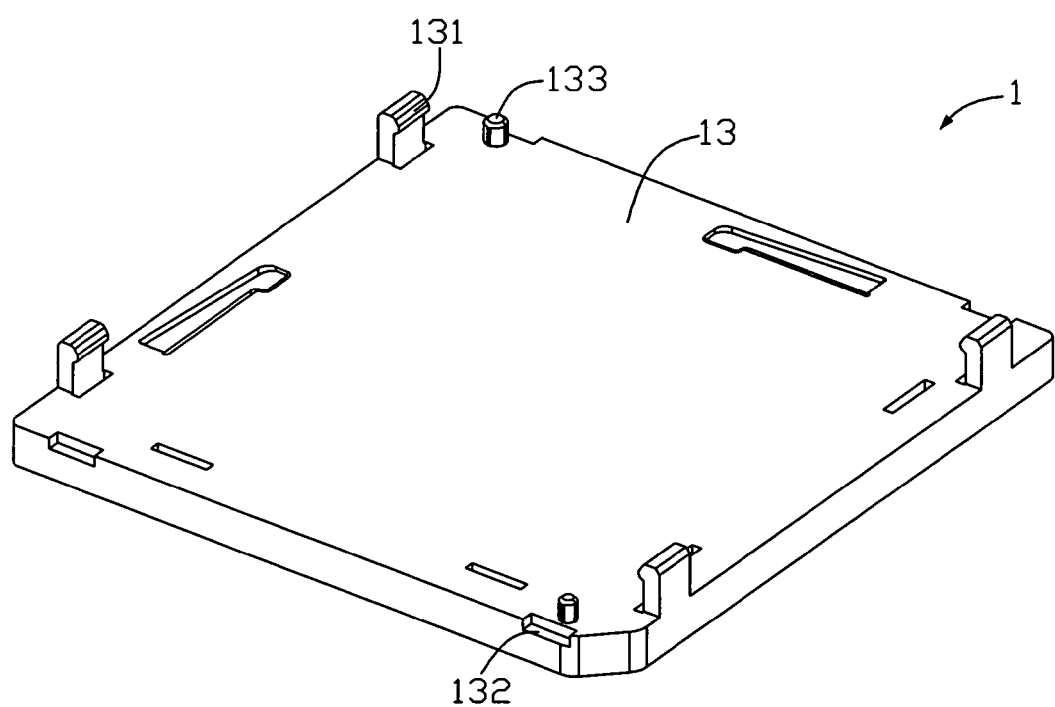
FIG. 2 is an isometric view of the insulative housing of FIG. 1.

Referring to FIGS. 1-2, an electrical connector (not labeled) for electrically connecting an electronic package, such as an central processing unit (CPU) 2, with a circuit substrate, such as a printed circuit board (PCB) (not labeled) comprises an insulative housing 1, a plurality of contacts 4 and a fastening device 3.

The insulative housing 1 comprises a bottom wall 11, side walls 12 extending upwardly from the bottom wall 11 and a receiving space 111 for receiving the CPU 2 formed by the bottom wall 11 and the side walls 12. The side wall 12 defines a spring arm 121 extending to the receiving space 111 and a plurality of holes 122 impenetrating into the side wall 12. When the CPU 2 is assembled into the receiving space 111, the spring arm will exert a force on the CPU 2 to make the CPU 2 securely located in the receiving space 111. The holes 122 can prevent the distortion of the insulative housing 1 when heated. The bottom wall 11 defines a under surface 13 for being assembled to the PCB. The under surface 13 defines a plurality of post members 133 matched with the PCB and a locking member 131 locked with the PCB for further securely locating the insulative housing 1 on the PCB and a recess 132 impenetrating to the bottom wall 11. In this embodiment of the present invention, the under surface 13 defines four locking members 131 and two pairs of recesses 132 at the edge of the under surface 13 with an symmetrical mode. The locking member 131 make the insulative housing 1 located on the PCB more steady and is easy to disassemble.

In this embodiment of the invention, the electrical connector comprises a pair of fastening device 3 and each is made of a long strip configuration. The fastening device 3 configured with a bow shape and comprises a body portion 32 with a sunk pressing portion (not labeled) pressed on the CPU 2 and two locking portions 31 at the two end of the body portion 32.

Figure 3:
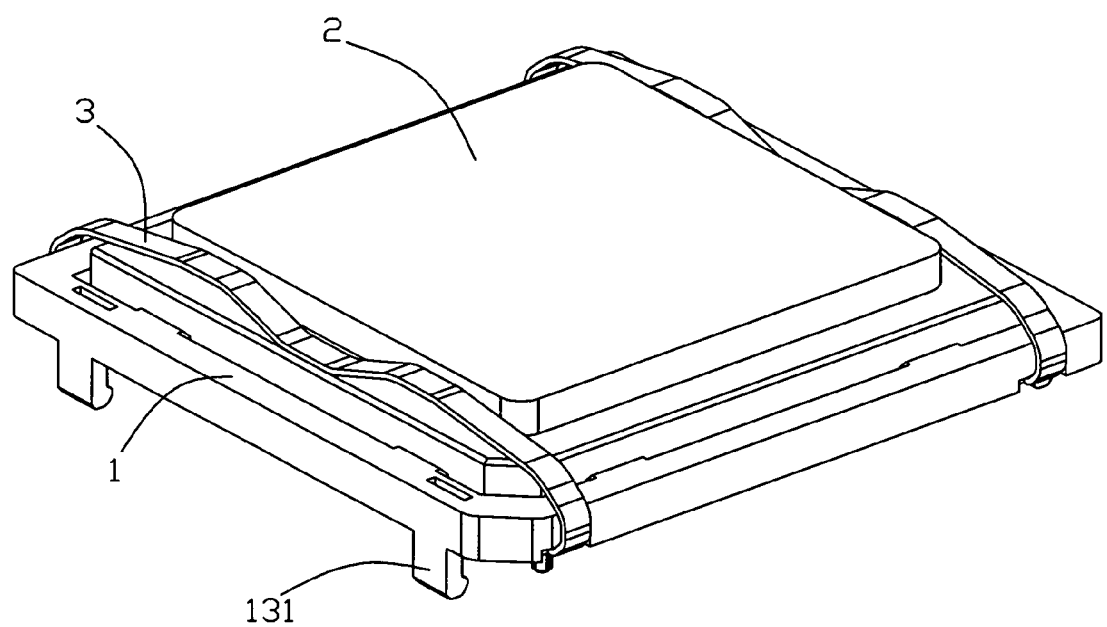
FIG. 3 is an assembly view of the electrical connector of FIG. 1, showing the fastening device fastened the CPU on the insulative housing.
Figure 4:
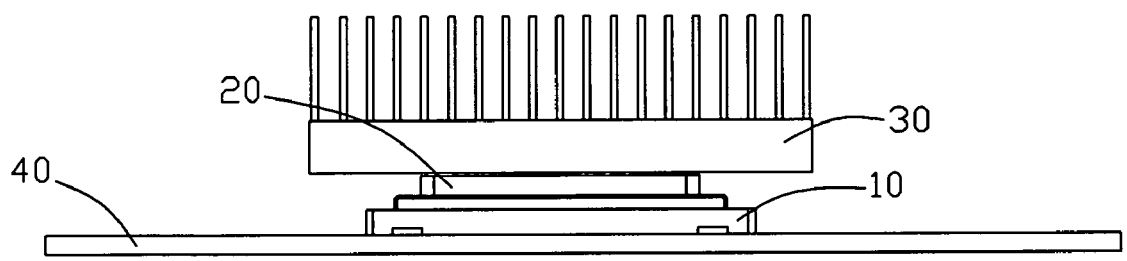
FIG. 4 is an assembly view of a conventional electrical connector, showing the radiator be assembled on the CPU.

Referring to FIG. 3, when the CPU 2 is assembled into the insulative housing 1, then assemble the two fastening devices 3 on the insulative housing 1, the body portions 32 press on the two sides of the CPU 2 and the locking portions 31 are locked with the recesses 132 for securely fastening the CPU 2 on the insulative housing 1. Thus even if exert an upwardly force on the CPU 2, the CPU 2 can also securely located on the insulative housing 1.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for connecting an electronic package with a circuit substrate, comprising:

an insulative housing comprising a bottom wall and a locking member extending downwardly from the bottom wall;

a plurality of contacts received in the bottom wall of the insulative housing; and a fastening device being configured by a single strip and comprising a pressing portion pressed on the electronic package and two locking portions locking with the insulative housing for fastening the electronic package on the insulative housing;

wherein the fastening device comprises a pair of arc sections located between the pressing portion and the locking portions;

wherein the electrical connector assembly comprises a pair of fastening devices.

2. The electrical connector as claimed in claim 1, wherein the bottom wall defines a pair of recesses and the locking portion locked with the recess for securely fastening the fastening device on the insulative housing.

3. The electrical connector as claimed in claim 1, wherein the locking member locks with the circuit substrate for fastening the insulative housing with the circuit substrate.

4. The electrical connector as claimed in claim 1, wherein the insulative housing comprises side walls extending upwardly from the bottom wall.

5. The electrical connector as claimed in claim 4, wherein the bottom wall and the side walls form a receiving space for receiving the electronic package.

6. The electrical connector as claimed in claim 5, wherein the side wall defines a spring arm extending from the inner side of the side wall to the receiving space.

7. An electrical connector assembly comprising:

a printed circuit board;

an insulative housing defining an upwardly facing receiving cavity;

a plurality of contacts disposed in the housing with contacting sections extending upwardly into the receiving cavity;

an electronic package received in the receiving cavity;

said housing equipped with a plurality of abutment devices to provide lateral forces upon the electronic package;

a plurality of fastening devices being discrete from the housing and defining two sections respectively to abut against the housing and the electronic package and impose a force upon the electronic package in a vertical direction to removeably retain the electronic package in the receiving cavity;

wherein the fastening device is made of a long strip configuration and pressed on one side of the electronic package.

8. The electrical connector assembly as claimed in claim 7, wherein said housing is further equipped with a plurality of locking members to securely mount the housing to the printed circuit board.

9. The electrical connector assembly as claimed in claim 7, wherein said locking members are unitarily formed with the housing.

* * * * *